(12) United States Patent
Forbes et al.

(10) Patent No.: US 6,731,531 B1
(45) Date of Patent: May 4, 2004

(54) CARBURIZED SILICON GATE INSULATORS FOR INTEGRATED CIRCUITS

(75) Inventors: Leonard Forbes, Corvallis, OR (US); Kie Y. Ahn, Chappaqua, NY (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/650,553

(22) Filed: Aug. 30, 2000

Related U.S. Application Data

(62) Division of application No. 08/903,453, filed on Jul. 29, 1997.

(51) Int. Cl.[7] ............................................. G11C 11/24
(52) U.S. Cl. ..................... 365/149; 365/185.26; 257/77
(58) Field of Search ........................... 365/149, 185.26; 257/77

(56) References Cited

U.S. PATENT DOCUMENTS

| | | | |
|---|---|---|---|
| 3,792,465 A | 2/1974 | Collins et al. | ........... 340/324 R |
| 4,113,515 A | 9/1978 | Kooi et al. | ................... 148/1.5 |

(List continued on next page.)

FOREIGN PATENT DOCUMENTS

| | | | |
|---|---|---|---|
| EP | 0291951 | 8/1993 | ............ H01L/29/64 |
| EP | 0681333 | 11/1995 | ........... H01L/29/788 |
| JP | 57-126175 | 8/1982 | ............ H01L/31/04 |
| JP | 60-184681 | 9/1985 | ............ C23C/16/30 |
| JP | 60-242678 | 12/1985 | ............ H01L/29/73 |
| JP | 62-122275 | 6/1987 | ............ H01L/27/78 |
| JP | 63-181473 | 7/1988 | ............ H01L/29/78 |
| JP | 63-219172 | 9/1988 | ............ H01L/29/78 |
| JP | 63-289960 | 11/1988 | ............ H01L/29/64 |
| JP | 01-115162 | 5/1989 | ............ H01L/29/78 |
| JP | 02-203564 | 8/1990 | ............ H01L/29/46 |
| JP | 03-222367 | 10/1991 | ......... H01L/29/784 |
| JP | 04-056769 | 2/1992 | ............ C23C/16/32 |
| JP | 06-224431 | 8/1994 | ......... H01L/29/784 |
| JP | 06-302828 | 10/1994 | ......... H01L/29/788 |
| JP | 07-115191 | 5/1995 | ............ H01L/29/78 |
| JP | 07-226507 | 8/1995 | ............ H01L/29/78 |
| JP | 08-255878 | 10/1996 | ............ H01L/27/10 |

OTHER PUBLICATIONS

Burns, S.G., et al., *In: Principles of Electronic Circuits*, West Publishing Co., St. Paul, MN,(1987),382–383.

Burns, S.,et al., *In: Principles of Electronic Circuits*, West Publishing Company,(1987),p. 380.

Capasso, F.,et al.,"New Floating–Gate AlGaAs/GaAs Memory Devices with Graded–Gad Electron Injector and Long Retention Times", *IEEE Electron Device Letters*, (1988),pp. 377–379.

(List continued on next page.)

*Primary Examiner*—Richard Elms
*Assistant Examiner*—Tuan T. Nguyen
(74) *Attorney, Agent, or Firm*—Schwegman, Lundberg, Woessner & Kluth, P.A.

(57) ABSTRACT

Silicon carbide films are grown by carburization of silicon to form insulative films. In one embodiment, the film is used to provide a gate insulator for a field effect transistor. The film is grown in a microwave-plasma-enhanced chemical vapor deposition (MPECVD) system. A silicon substrate is first etched in dilute HF solution and rinsed. The substrate is then placed in a reactor chamber of the MPECVD system in hydrogen along with a carbon containing gas. The substrate is then inserted into a microwave generated plasma for a desired time to grow the film. The microwave power varies depending on substrate size. The growth of the film may be continued following formation of an initial film via the above process by using a standard CVD deposition of amorphous SiC. The film may be used to form gate insulators for FET transistors in DRAM devices and flash type memories. It may be formed as dielectric layers in capacitors in the same manner.

24 Claims, 3 Drawing Sheets

U.S. PATENT DOCUMENTS

| | | | |
|---|---|---|---|
| 4,460,670 A | 7/1984 | Ogawa et al. | 430/57 |
| 4,462,150 A | 7/1984 | Nishimura et al. | 29/576 B |
| 4,473,836 A | 9/1984 | Chamberlain | 27/14 |
| 4,507,673 A | 3/1985 | Aoyama et al. | 357/23 R |
| 4,657,699 A | 4/1987 | Nair | 252/513 |
| 4,738,729 A | 4/1988 | Yoshida et al. | 136/258 |
| 4,768,072 A | 8/1988 | Seki et al. | 357/29 |
| 4,769,686 A * | 9/1988 | Horiuchi et al. | 357/23.8 |
| 4,841,349 A | 6/1989 | Nakano | 357/30 |
| 4,849,797 A | 7/1989 | Ukai et al. | 357/237 |
| 4,893,273 A | 1/1990 | Usami | 365/185 |
| 4,980,303 A | 12/1990 | Yamauchi | 437/31 |
| 5,049,950 A | 9/1991 | Fujii et al. | 357/2 |
| 5,111,430 A | 5/1992 | Morie | 365/185 |
| 5,145,741 A | 9/1992 | Quick | 428/402 |
| 5,189,504 A | 2/1993 | Nakayama et al. | 257/422 |
| 5,235,195 A | 8/1993 | Tran et al. | 257/59 |
| 5,260,593 A | 11/1993 | Lee | 257/316 |
| 5,293,560 A | 3/1994 | Harari | 365/185 |
| 5,298,796 A | 3/1994 | Tawel | 307/201 |
| 5,317,535 A | 5/1994 | Talreja et al. | 365/185 |
| 5,369,040 A | 11/1994 | Halvis et al. | 437/3 |
| 5,371,383 A | 12/1994 | Miyata et al. | 257/77 |
| 5,393,999 A | 2/1995 | Malhi | 257/289 |
| 5,407,845 A | 4/1995 | Nasu et al. | 437/40 |
| 5,415,126 A | 5/1995 | Loboda et al. | 117/88 |
| 5,449,941 A | 9/1995 | Yamazaki et al. | 257/411 |
| 5,455,432 A | 10/1995 | Hartsell et al. | 257/77 |
| 5,465,249 A | 11/1995 | Cooper et al. | 365/149 |
| 5,477,485 A | 12/1995 | Bergemont et al. | 365/185.24 |
| 5,508,543 A | 4/1996 | Hartstein et al. | 257/314 |
| 5,530,581 A | 6/1996 | Cogan | 359/265 |
| 5,557,114 A | 9/1996 | Leas et al. | 257/59 |
| 5,557,122 A | 9/1996 | Shrivastava et al. | 257/309 |
| 5,562,769 A | 10/1996 | Dreifus et al. | 117/86 |
| 5,580,380 A | 12/1996 | Liu et al. | 117/86 |
| 5,604,357 A * | 2/1997 | Hori | 257/24 |
| 5,623,442 A | 4/1997 | Gotou et al. | 365/185.08 |
| 5,629,222 A | 5/1997 | Yamazaki et al. | 438/259 |
| 5,654,208 A | 8/1997 | Harris et al. | 438/522 |
| 5,661,312 A | 8/1997 | Weitzel et al. | 257/77 |
| 5,670,790 A | 9/1997 | Katoh et al. | 257/14 |
| 5,698,869 A * | 12/1997 | Yoshimi et al. | 257/192 |
| 5,719,410 A | 2/1998 | Suehiro et al. | 257/77 |
| 5,734,181 A | 3/1998 | Ohba et al. | 257/77 |
| 5,740,104 A | 4/1998 | Forbes | 365/185.03 |
| 5,754,477 A | 5/1998 | Forbes | 365/185.33 |
| 5,786,250 A | 7/1998 | Wu et al. | 438/254 |
| 5,789,276 A | 8/1998 | Leas et al. | 438/59 |
| 5,798,548 A | 8/1998 | Fujiwara | 257/319 |
| 5,801,401 A * | 9/1998 | Forbes | 257/77 |
| 5,808,336 A | 9/1998 | Miyawaki | 257/315 |
| 5,846,859 A | 12/1998 | Lee | 438/253 |
| 5,858,811 A | 1/1999 | Tohyama | 438/75 |
| 5,877,041 A | 3/1999 | Fuller | 438/105 |
| 5,886,368 A * | 3/1999 | Forbes et al. | 257/77 |
| 5,886,376 A * | 3/1999 | Acovic et al. | 257/316 |
| 5,886,379 A | 3/1999 | Jeong | 257/319 |
| 5,898,197 A | 4/1999 | Fujiwara | 257/317 |
| 5,907,775 A | 5/1999 | Tseng | 438/261 |
| 5,912,837 A | 6/1999 | Lakhani | 365/185.02 |
| 5,976,926 A * | 11/1999 | Wu et al. | 438/237 |
| 5,989,958 A | 11/1999 | Forbes | 438/257 |
| 6,018,166 A | 1/2000 | Lin et al. | 257/22 |
| 6,031,263 A * | 2/2000 | Forbes et al. | 257/77 |
| 6,034,001 A | 3/2000 | Shor et al. | 438/931 |
| 6,075,259 A | 6/2000 | Baliga | 257/77 |
| 6,084,248 A * | 7/2000 | Inoue | 257/66 |
| 6,093,937 A * | 7/2000 | Yamazaki et al. | 257/59 |
| 6,099,574 A * | 8/2000 | Fukuda et al. | 395/500.21 |
| 6,100,193 A | 8/2000 | Suehiro et al. | 438/685 |
| 6,130,147 A | 10/2000 | Major et al. | 438/604 |
| 6,144,581 A | 11/2000 | Diorio et al. | 365/185.03 |
| 6,163,066 A * | 12/2000 | Forbes et al. | 257/77 |
| 6,166,401 A * | 12/2000 | Forbes | 257/77 |
| 6,271,566 B1 * | 8/2001 | Tsuchiaki | 257/347 |
| 6,365,919 B1 | 4/2002 | Tihanyi et al. | 257/77 |

OTHER PUBLICATIONS

Ng, K., In: Complete Guide To Semiconductor Devices, McGraw–Hill, Inc. New York,(1995),pp. 322–328, 605–608.

Wolf, S.,"Semiconductor Memory Process Integration", Silicon Processing for The VLSI Era, vol. 2: Process Integration, (1990),pp. 623–628.

Beltram, F., et al., "GaAlAs/GaAs Floating–Gate Memory Devices with Graded–Gap Injector Grown by Molecular–Beam Epitaxy", IEEE Transactions on Electron Devices, 35, Abstract No. VA–7, 2451, (Dec. 1988).

Burns, S.G., et al., In: Principles of Electronic Circuits, West Publishing Co., St. Paul, MN, 382–383, (1987).

Lin, B., et al., "Dramatic Reduction of Sidegating in MOD-FET's", IEEE Transactions on Electron Devices, 35, Abstract No. VA–6, p. 2451, (1988).

Lott, J.A., et al., "Charge Storage in InAlAs/InGaAs/InP Floating Gate Heterostructures", Electronics Letters, 26, 972–973, (Jul. 5, 1990).

Mohammed, S.N., et al., "Emerging Gallium Nitride Based Devices", Proceedings of the IEEE, 83, 1306–1355, (Oct. 1995).

Sze, S.M., In: Physics of Semiconductor Devices, Wiley–Interscience, New York, p. 496–497, (1969).

Wolf, "Silicon Processing for the VLSI Era vol. 2: Process Integration", Lattice Press, 623–626, (1990).

Akasaki, I., et al., "Effects of AlN Buffer Layer on Crystallographic Structure and on Electrical and Optical Properties of GaN and Ga(1–x)Al(x)N [0< x (< or =) 0.4] Films Grown on Sapphire Substrate by MOVPE", J, Crystal Growth, 98, 209–219, (1989).

Alok, D., et al., "Electrical Properties of Thermal Oxide Grown on N–type 6H–Silicon Carbide", Applied Physcis Letters, 64, 2845–2846, (May 23, 1994).

Andrieux, M., et al., "Interface and Adhesion of PACVD SiC Based Films on Metals", Supp. Le Vide: science, technique et applications, 279, 212–214, (1996).

Bachmann, P., et al., "Influence on Surface Modifications on the Electronic Properties of CVD Diamond Films", Diamond and Related Materials, 5, 1378–1383, (1996).

Baglee, D., "Characteristics & Reliability of 100 Angstrom Oxides", IEEE 22nd Annual Proc.: Reliability Physics, Las Vegas, 152–155, (Apr. 3–5, 1984).

Beheim, G., et al., "Magnetron Plasma Etching of SiC for Microstructures", Proc: SPIE—Integrated Optics and Microstructures III, San Jose, CA, 82–86, (Jan. 29, 1996).

Bengtsson, S., et al., "Applications of Aluminum Nitride Films Deposited by Reactive Sputtering to Silicon–On–Insulator Materials", Japanese J. Applied Physics, 35, 4175–4181, (1996).

Benjamin, M., et al., "UV Photoemission Study of Heteroepitaxial AlGaN Films Grown on 6H–SiC", Applied Surface Science, 104/105, 455–460, (1996).

Bermudez, V., et al., "The Growth and Properties of Al and AlN Films on GaN(0001)—(1 × 1)", J. Applied Physics, 79, 110–119, (Jan. 1996).

Casey, H., et al., "Low Interface Trap Density for Remote Plasma Deposited SiO2 on n–type GaN", *Applied Phys. Lett.*, 68, 1850–1852, (Mar. 1996).

Chang, C., et al., "Novel Passivation Dielectrics–The Boron– or Phosphorus–Doped Hydrogenated Amorphous Silicon Carbide Films", *Journal of the Electrochemical Society*, 132, 418–422, (Feb. 1985).

Choi, J., et al., "Effect of Deposition Conditions and Pre-treatments on the Microstructure of MPECVD Diamond Thin Films", *Materials Chemistry and Physics*, 45, 176–179, (1996).

Clarke, G., et al., "The Infrared Properties of Magnetron–Sputtered Diamond–Like Thin Films", *Thin Solid Films*, 280, 130–135, (1996).

Compagnini, G., et al., "Spectroscopic Characterization of Annealed Si(1–x)C(x) Films", *J. Materials Res.*, 11, 2269–2273, (Sep. 1996).

Dartnell, N., et al., "Reactive Ion Etching of Silicon Carbide (Si(x)C(1–x))", *Vacuum*, 46, 349–355, (1995).

Demichelis, F., et al., "Influence of Doping on the Structural and Optoelectronic Properties of Amorphous and Microcrystalline Silicon Carbide", *Journal of Applied Physics*, 72, 1327–1333, (Aug. 15, 1992).

Demichelis, F., et al., "Physical Properties of Undoped and Doped Microcrystalline SiC:H Deposited By PECVD", *Materials Research Society Symposium Proceedings*, 219, Anaheim, CA, 413–418, (Apr.30–May 3, 1991).

Dipert, B., et al., "Flash Memory Goes Mainstream", *IEEE Spectrum*, 30, 48–52, (Oct. 1993).

Fissel, A., et al., "Epitaxial Growth of SiC Thin Films on Si–stabilized alpha–SiC (0001) at Low Temperatures by Solid–source Molecular Beam Epitaxy", *Journal of Crystal Growth*, 154, 72–80, (1995).

Friedrichs, P., et al., "Interface Properties of Metal–Oxide–Semiconductor Structures on N–Type 6H and 4H–SiC", *J. Applied Physics*, 79, 7814–7819, (May 15, 1996).

Fujii, T., et al., "Bonding Structures in Highly Photoconductive a–SiC:H Films Deposited by Hybrid–Plasma Chemical Vapor Deposition", *Journal of Non–Crystalline Solids*, 198–200, 577–581, (1996).

Goetzberger, A., et al., *Applied Solid State Science: Advances in Materials and Device Research*, R. Wolfe, ed., Academic Press, New York, Including p. 233, (1969).

Graul, J., et al., "Growth Mechanism of Polycrystalline beta–SiC Layers on Silicon Substrate", *Applied Phys. Lett.*, 21, 67–69, (Jul. 1972).

Hamakawa, Y., et al., "Optoelectronics and Photovoltaic Applications of Microcrystalline SiC", *Materials Research Society Symposium Proceedings*, 164, Boston, MA, 291–301, (Nov. 29–Dec. 1, 1989).

He, Z., et al., "Ion–beam–assisted Deposition of Si–carbide Films", *Thin Solid Films*, 260, 32–37, (1995).

Hu, G., et al., "Will Flash Memory Replace Hard Disk Drive?", *1994 IEEE International Electron Device Meeting*, Panel Discussion, Session 24, Outline, 2 pages, (Dec. 1994).

Hwang, J., et al., "High Mobility beta–SiC Epilayer Prepared by Low–pressure Rapid Thermal Chemical Vapor Deposition on a (100) Silicon Substrate", *Thin Solid Films*, 272, 4–6, (1996).

Jou, S., et al., "Electron Emission Characterization of Diamond Thin Films Grown from a Solid Carbon Source", *Thin Solid Films*, 280, 256–261, (1996).

Kothandaraman, M., et al., "Reactive Ion Etching of Trenches in 6H–SiC", *J. Electronic Materials*, 25, 875–878, (1996).

Kumbhar, A., et al., "Growth of Clean Amorphous Silicon–Carbon Alloy Films by Hot–Filament Assisted Chemical Vapor Deposition Technique", *Applied Phys. Lett*, 66, 1741–1743, (April 1995).

Lakshmi, E., et al., "Interface–State Characteristics of GaN/GaAs MIS Capacitors", *Solid–State Electronics*, 25, 811–815, (1982).

Lanois, F., et al., "Angle Etch Control for Silicon Carbide Power Devices", *Applied Phys. Lett.*, 69, 236–238, (Jul. 1996).

Lau, S., et al., "Optoelectronic Properties of Highly Conductive Microcrystalline SiC Produced by Laser Crystallization of Amorphous SiC", *J. of Non–Crystalline Solids*, 198–200, 907–910, (1996).

Leggieri, G., et al., "Laser Ablation Deposition of Silicon Carbide Films", *Applied Surface Science*, 96–98, 866–869, (1996).

Lei, T., et al., "Epitaxial Growth and Characterization of Zinc–Blende Gallium Nitride on (001) Silicon", *J. Appl. Phys.*, 71, 4933–4943, (May 1992).

Liu, J., et al., "Formation of SiC Films on Silicon Field Emitters", *Materials Res. Soc. Symp. Proc.*, 311, San Francisco, CA, (Apr. 13–15, 1993).

Liu, J., et al., "Modification of Si Field Emitter Surfaces by Chemical Conversion to SiC", *J. Vac. Sci. Technology*, B 12, 717–721, (1994).

Luo, J., et al., "Localized Epitaxial Growth of Hexagonal and Cubic SiC Films on Si by Vacuum Annealing", *Applied Phys. Lett.*, 69, 916–918, (Aug. 1996).

Martins, R., et al., "Transport Properties of Doped Silicon Oxycarbide Microcrystalline Films Produced by Spatial Separation Techniques", *Solar Energy Materials and Solar Cells*, 41–42, 493–517, (1996).

Martins, R., et al., "Wide Band Gap Microcrystalline Silicon Thin Films", *Diffusion and Defect Data : Solid State Phenomena*, 44–46, Part 1, Scitec Publications, 299–346, (1995).

Maury, F., et al., "Chemical Vapor Co–Deposition of C and SiC at Moderate Temperature for the Synthesis of Compositionally Modulated Si(x)C(1–x) Ceramic Layers", *Surface and Coatings Technology*, 76–77, 119–125, (1995).

McLane, G., et al., "High Etch Rates of SiC in Magnetron Enhanced SF(6) Plasmas", *Applied Phys. Lett.*, 68, 3755–3757, (Jun. 1996).

Mogab, C., et al., "Conversion of Si to Epitaxial SiC by Reaction with C(2)H(2)", *J. Applied Physics*, 45, 1075–1084, (Mar. 1974).

Molnar, R., et al., "Growth of Gallium Nitride by Electron–Cyclotron Resonance Plasma–Assisted Molecular–Beam Epitaxy: The Role of Charged Species", *J. Appl. Phys.*, 76, 4587–4595, (1994).

Muller, K., et al., "Trench Storage Node Technology for Gigabit DRAM Generations", *Digest IEEE International Electron Devices Meeting*, San Francisco, CA, 507–510, (Dec. 1996).

Nemanich, P., et al., "Diamond Negative Electron Affinity Surfaces, Structures and Devices", *Proc. : Third International Conference on Applications of Diamond Films and Related Materials*, 1, Gaithersburg, MD, 17–24, (1995).

Nemanich, R., et al., "Negative Electron Affinity Surfaces of Aluminum Nitride and Diamond", *Diamond and Related Materials*, 5, 790–796, (1996).

Ouyang, M., et al., "Deposition of Diamond–Like Carbon Films via Excimer Laser Ablation of Polybutadiene", *Materials Science and Engineering*, B39, 228–231, (1996).

Pankove, J., "Photoelectric Emission", *In: Optical Processes in Semiconductors*, Dover Publications Inc., New York, 287–301, (1971).

Pancove, J., et al., "Photoemission from GaN", *Applied Phys. Lett.*, 25, 53–55, (1974).

Papadas, C., et al., "Modeling of the Intrinsic Retention Charcteristics of FLOTOX EEPROM Cells Under Elevated Temperature Conditions", *IEEE Transaction on Electron Devices*, 42, 678–682, (Apr. 1995).

Patuwathavithane, C., et al., "Oxidation Studies for 6H–SiC", *Proc. 4th Int. Conf. on Amorphous and Crystalline Silicon Carbide IV*, Santa Clara, CA, 163–169, (Oct. 9–11, 1991).

Pereyra, I., et al., "Wide Gap a–Si(1–x)C(x): H Thin Films Obtained Under Starving Plasma Deposition Conditions", *J. Non–Crystalline Solids*, 201, 110–118, (1996).

Pollack, S., "Electron Transport Through Insulating Thin Films", *Appl. Solid–State Science*, 1, 345–355, (1969).

Prendergast, J., "FLASH or DRAM: Memory Choice for the Future", *IEEE Electron Device Meeting*, Session 25, Phoenix, AZ, (1995).

Rahman, M., et al., "Preparation and Electrical Properties of An Amorphous SiC/ Crystalline Si p(+)n Heterostructure", *Japanese J. Applied Physics*, 23, 515–524, (May 1984).

Renlund, G., et al., "Silicon Oxycarbide Glasses: Part I. Preparation and Chemistry", *Journal of Materials Research*, 6, 2716–2722, (Dec. 1991).

Renlund, G., et al., "Silicon Oxycarbide Glasses: Part II. Structure and Properties", *Journal of Materials Research*, 6, 2723–2734, (Dec. 1991).

Sakata, I., et al., "Amorphous Silicon/Amorphous Silicon Carbide Heterojunctions Applied to Memory Device Structures", *Electronics Letters*, 30(9), 688–689, (1994).

Schmidt, I., et al., "Low Temperature Diamond Growth Using Fluorinated Hydrocarbons", *Diamond and Related Materials*, 5, 1318–1322, (1996).

Serre, C., et al., "Ion–Beam Synthesis of Amorphous SiC Films: Structural Analysis and Recrystallization", *J. Appl. Phys.*, 79, 6907–6913, (May 1996).

Sim, S., et al., "A New Planar Stacked Technology (PST) for Scaled and Embedded DRAMs", *Digest IEEE Int. Electron Devices Meeting*, San Francisco, CA, 504–507, (Dec. 1996).

Suzaki, Y., et al., "Quantum Size Effects of a–Si(:H) /a–SiC(:H) Multilayer Films Prepared by rf Sputtering", *Abstracts of Papers Published in the Int. J. Japenese Soc. for Precision Engineering*, 28, Abstract of Paper in vol. 60, 182, (Jun. 1994).

Svirkova, N., et al., "Deposition Conditions and Density-–of–States Spectrum of a Si(1–x)C(x) :H Films Obtained by Sputtering", *Semiconductors*, 28, 1164–1169, (Dec. 1994).

Sze, S., *Physics of Semiconductors*, 2nd Edition., John Wiley & Sons, Pub., New York, ISBN 0471056618, (1981).

Tarui, Y., "Flash Memory Features Simple Structure, Superior Integration", *JEE*, 30, 84–87, (Sep. 1993).

Tenhover, M., et al., "DC–Magnetron Sputtered Silicon Carbide", *Materials Res. Soc. Symp. Proc.*, 356, Boston, MA, 227–232, (Nov. 28–Dec. 02, 1994).

Thomas, J., et al., "Plasma Etching and Surface Analysis of a–SiC :H Films Deposited by Low Temperature Plasma Enhanced Chemical Vapor Deposition", *Materials Res. Soc. Symp. Proc.*, 334, Boston, MA, 445–450, (Nov. 29–Dec. 02, 1993).

Tiwari, S., et al., "A silicon nanocrystal based memory", *Appl. Physics Lett.*, 68, 1377–1379, (1996).

Tiwari, S., et al., "Volatile and Non–Volatile Memories in Silicon with Nano–Crystal Storage", *Int'l Electron Devices Meeting: Technical Digest*, Washington, DC, 521–524, (Dec. 1995).

Tucker, C., et al., "Ion–beam–assisted Deposition of Non-hydrogenated a–Si:C Films", *Can. J. Physics*, 74, 97–101, (1996).

van der Weide, J., et al., "Negative–electron–affinity Effects on the Diamond (100) Surface", *Physical Review B [Condensed Matter]*, 50, 5803–5806, (Aug. 15, 1994).

Vodakov, Y., et al., "Diffusion and Solubility of Impurities in Silicon Carbide", *In: Silicon Carbide*, R.C. Marshall, et al., eds., Univ. of South Carolina Press, 508–519, (1973).

Wahab, Q., et al., "3C–SiC / Si / 3C–SiC Epitaxial Trilayer Films Deposited on Si (111) Substrates by Reactive Magnetron Sputtering", *J. Materials Res.*, 10, 1349–1351, (Jun. 1995).

Watanabe, A., et al., "SiC Thin Film Preparation by ArF Excimer Laser Chemical Vapor Deposition. Part 1: Rate of Photolysis of Alkylsilanes by ArF Excimer Laser and their Decomposition Products", *Thin Solid Films*, 274, 70–75, (1996).

Wolter, S., et al., "Textured Growth of Diamond on Silicon via in situ Carburization and Bias–Enhanced Nucleation", *Appl. Phys. Lett.*, 62, 1215–1217, (Mar. 1993).

Wu, K., et al., "The Growth and Characterization of Silicon/ Silicon Carbide Heteroepitaxial Films on Silicon Substrates by Rapid Thermal Chemical Vapor Deposition", *Japanese J. Appl. Phys.*, 35, 3836–3840, (1996).

Yamaguchi, Y., et al., "Properties of Heteroepitaxial 3C–SiC Films Grown by LPCVD", *Digest of Tech. Papers: 8th Int. Conf. on Solid–State Sensors and Actuators and Eurosensors IX*, vol. 2, Stockholm, Sweden, 190–193, (Jun. 1995).

Yamanashi, H., et al., "Deposition of Silicon Compound Thin Films in DC Discharge Plasma Using Hydrogen–Hexamethyldisilane Gas Mixture", *Proc.: Int. Symp. on Surfaces and Thin Films of Electronic Materials. Bull. of the Res. Institute of Electronics*, Shizuoka University, 30, 95–98, (1995).

Yee, A., et al., "The Effect of Nitrogen on Pulsed Laser Deposition of Amorphous Silicon Carbide Films: Properties and Structure", *J. Materials Research*, 11, 1978–1986, (1996).

Yoder, M., "Wide Bandgap Semiconductor Materials and Devices", *IEEE Transactions on Electron Devices*, 43, 1633–1636, (Oct. 1996).

Zirinsky, S., et al., "Electrical Resistivity of Amorphous Silicon Resistor Films", *Extended Abstracts of the Spring Meeting of the Electrochemical Society*, Washington, DC, pp. 147–149, (1971).

\* cited by examiner

CARBURIZED SILICON GATE INSULATORS FOR INTEGRATED CIRCUITS

This application is a Divisional of U.S. application Ser. No. 08/903,453, filed on Jul. 29, 1997.

FIELD OF THE INVENTION

The present invention relates to semiconductor field effect transistors, and in particular to insulators for gates of field effect transistors.

BACKGROUND OF THE INVENTION

Field-effect transistors (FETs) are typically produced using a standard complementary metal-oxide-semiconductor (CMOS) integrated circuit fabrication process. As is well known in the art, such a process allows a high degree of integration such that a high circuit density can be obtained with the use of relatively few well-established masking and processing steps. A standard CMOS process is typically used to fabricate FETs that each have a gate electrode that is composed of n-type conductively doped polycrystalline silicon (polysilicon) material or other conductive materials.

Field effect transistors (FETs) are used in many different types of memory devices, including EPROM, EEPROM, EAPROM, DRAM and flash memory devices. They are used as both access transistors, and as memory elements in flash memory devices. In these applications, the gate is electrically isolated from other conductive areas of the transistor by an oxide layer. A drawback with FETs having grown oxide insulators is manifested in the use of Fowler-Nordheim tunneling to implement nonvolatile storage devices, such as in electrically erasable and programmable read only memories (EEPROMs). EEPROM memory cells typically use CMOS floating gate FETs. A floating gate FET typically includes a floating (electrically isolated) gate that controls conduction between source and drain regions of the FET. In such memory cells, data is represented by charge stored on the floating gates. Fowler-Nordheim tunneling is one method that is used to store charge on the floating gates during a write operation and to remove charge from the polysilicon floating gate during an erase operation. The high tunneling voltage of grown oxides used to provide such isolation increases the time needed to store charge on the floating gates during the write operation and the time needed to remove charge from the polysilicon floating gate during the erase operation. This is particularly problematic for "flash" EEPROMs, which have an architecture that allows the simultaneous erasure of many floating gate transistor memory cells. Since more charge must be removed from the many floating gates in a flash EEPROM, even longer erasure times are needed to accomplish this simultaneous erasure. There is a need in the art to obtain floating gate transistors allowing faster storage and erasure, such as for use in flash EEPROMs.

Many gate insulators have been tried, such as grown oxides, CVD (chemical vapor deposition) oxides, and deposited layers of silicon nitride, aluminum oxide, tantalum oxide, and titanium oxide with or without grown oxides underneath. The only commonly used gate insulator at the present time is thermally grown silicon oxide. If other insulators are deposited directly on the silicon, high surface state densities result. Composite layers of different insulators are first grown and then deposited, such as oxide-CVD oxide or oxide-CVD nitride combinations. If composite insulators are used, charging at the interface between the insulators results due to trap states at this interface, a bandgap discontinuity, and/or differences in conductivity of the films.

There is a need for a gate insulator which provides a low tunneling barrier. There is a further need to reduce the tunneling time to speed up storage and retrieval of data in memory devices. There is yet a further need for a gate insulator with less charging at the interface between composite insulator layers. A further need exists to form gate insulators with low surface state densities.

SUMMARY OF THE INVENTION

Silicon carbide films are grown by carburization of silicon to form insulative films. In one embodiment, the film is used to provide a gate insulator for a field effect transistor. The film is grown in a microwave-plasma-enhanced chemical vapor deposition (MPECVD) system. A silicon substrate is first etched in dilute HF solution and rinsed. The substrate is then placed in a reactor chamber of the MPECVD system in hydrogen along with a carbon containing gas. The substrate is then inserted into a microwave generated plasma for a desired time to grow the film. The microwave power varies depending on substrate size.

The resulting SiC film is preferably amorphous and has low surface state densities. It provides a gate insulator having a much lower tunneling barrier as compared to grown oxides which are widely used today. The lower tunneling barrier results in reduced tunneling times and allows reduction of power supply voltages. Further, charging at interfaces between composite insulators is reduced.

Methane, and other carbon containing gases having from about one to ten carbon atoms per molecule may be used. The temperature of the system may vary between approximately 915 degrees C. to 1250 degrees C., with films growing faster at higher temperatures. Thicknesses of the resulting film range from 2 nm in a time period as short as 3 minutes, to as thick as 4500 Angstrom in one hour. The thicker films require longer time and higher temperature since the formation of SiC is a diffusion limited process.

The growth of the film may be continued following formation of an initial film via the above process by using a standard CVD deposition of amorphous SiC to form a composite insulator. The film may be used to form gate insulators for flash type memories as well as gate insulators for CMOS and MOS transistors used in semiconductors such as DRAMs. Further, since SiC has a fairly high dielectric constant, it may be formed as dielectric layers in capacitors in the same manner. It can also be used to form gate insulators for photo sensitive FETs for imaging arrays.

DESCRIPTION OF THE EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The terms wafer and substrate used in the following description include any semiconductor-based structure having an exposed surface with which to form the integrated circuit structure of the invention. Wafer and substrate are used interchangeably to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The following detailed description is, therefore, not to be taken in a limiting sense, and the scope of the present invention is defined by the appended claims.

Figure 1:
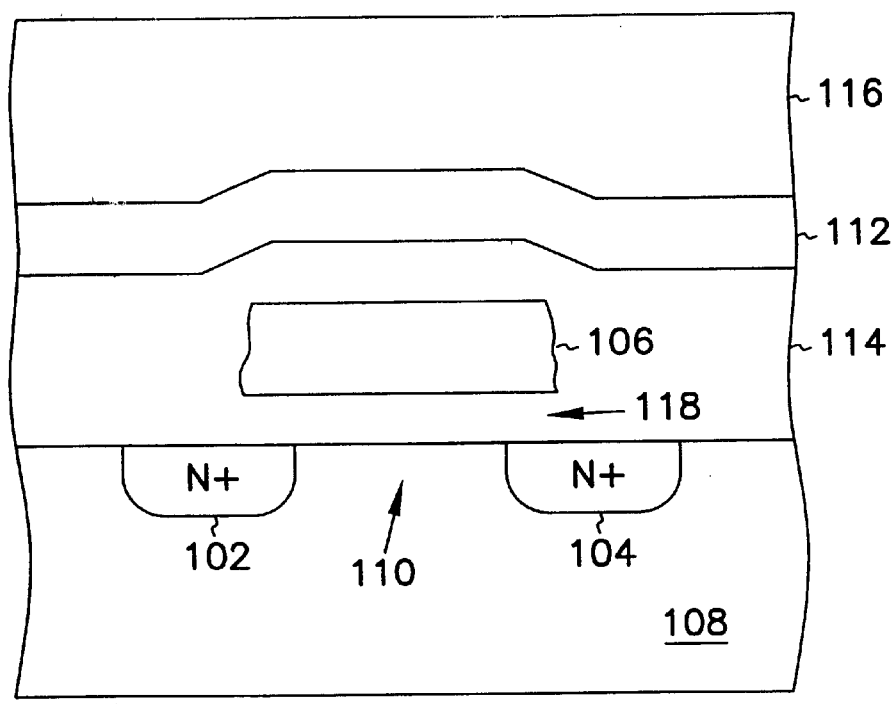
FIG. 1 is a cross-sectional view, illustrating one embodiment of a transistor according to one aspect of the invention, including a grown silicon carbide (SiC) gate insulator.

FIG. 1 is a cross-sectional view illustrating generally, by way of example, one embodiment of a n-channel FET provided by the invention. The FET includes a source region 102, a drain region 104 and a gate region 106. In one embodiment, source 102 and drain 104 are fabricated by forming regions of highly doped (n+) regions in a lightly doped (p−) silicon semiconductor substrate 108. In another embodiment, substrate 108 includes a thin semiconductor surface layer formed on an underlying insulating portion, such as in a SOI or other thin film transistor process technology. Source 102 and drain 104 are separated by a predetermined length in which a channel region 110 is formed.

In one embodiment, for example, layer 112 is a polysilicon control gate in a floating gate transistor in an electrically erasable and programmable read-only memory (EEPROM) memory cell. In this embodiment, gate 106 is floating (electrically isolated) for charge storage thereupon, such as by known EEPROM techniques. In another embodiment, for example, layer 112 is, a metal or other conductive interconnection line that is located above gate 106.

The upper layers, such as layer 112 can be covered with a layer 116 of a suitable insulating material in the conventional manner, such as for isolating and protecting the physical integrity of the underlying features. Gate 106 is isolated from channel 110 by an insulating layer 118, which is formed of carburized silicon, SiC.

SiC is a wide bandgap semiconductor material with a bandgap energy of about 2.1 eV. Moreover, SiC has an electron affinity of about 3.7 to 3.8 eV, in contrast to silicon, which has an electron affinity of about 4.2 eV. The smaller electron affinity of the SiC gate 106 material reduces the tunneling barrier potential which reduces the tunneling distance and increases the tunneling probability. This speeds the write and erase operations of storing and removing charge by Fowler-Nordheim tunneling to and from the gate 106, which is a floating gate. This is particularly advantageous for "flash" EEPROMs in which many floating gate transistor memory cells must be erased simultaneously. The large charge that must be transported by Fowler-Nordheim tunneling during the erasure of a flash EEPROM typically results in relatively long erasure times. By reducing the tunneling distance and increasing the tunneling probability, the SiC insulating layer 118 reduces erasure times in flash EEPROMs.

In one embodiment, the SiC layer 118 is grown in a microwave-plasma-enhanced chemical vapor deposition (MPECVD) system. A silicon substrate is first etched in dilute HF for about one minute and thoroughly rinsed in deionized water prior to insertion into a reactor, such as an Applied Materials single wafer system, model number 5000, which has four to five process chambers, each holding one wafer. Following insertion in the chamber, the chamber is first evacuated to a pressure of $10^{-4}$ or $10^{-5}$ mTorr. Carburization of silicon is then performed in a 2% to about 10% concentration of $CH_4/H_2$ with a chamber pressure of approximately 25 to 15 Torr depending upon the reactor configuration, horizontal or vertical. Typical microwave power is 1,000 watts for an 8 to 10 inch wafer to 250 to 300 watts for 3 to 4 inch wafers. The substrate is immersed roughly 0.5 cm into a resulting plasma. The temperature when the wafer is inserted into the reactor is typically about 400 to 500 degrees C., and is quickly ramped up to about 915 to 1250 degrees C. to carburize the silicon. The higher the temperature and concentration of methane in hydrogen, the faster the film growth. In further embodiments, an electrical bias of between zero and 200 volts may be applied during the carburization.

Besides methane and hydrogen mixtures, other carbon-containing gases may also be used, including those selected from the group consisting of ethane, ethylene, acetylene, ethanol, and other hydrocarbons with from about one to ten carbon atoms per molecule. Thicker, composite layers can also be formed by chemical vapor deposition CVD of amorphous SiC after an initial carburized silicon layer is formed.

Layers of SiC grown in the above manner are highly amorphous. The risk of obtaining undesired microcrystalline inclusions is greatly reduced. In addition, much lower surface state densities are obtained over deposition techniques, resulting in improved FET performance.

In one example, at 915 degrees C. with a 2% concentration of $CH_4/H_2$, a 2 nm film of SiC may be grown in about three minutes.

In a second example, at 1250 degrees C. with 4% concentration of $CH_4/H_2$, a 4500 Angstrom thickness film can be grown in about one hour.

Figure 2:
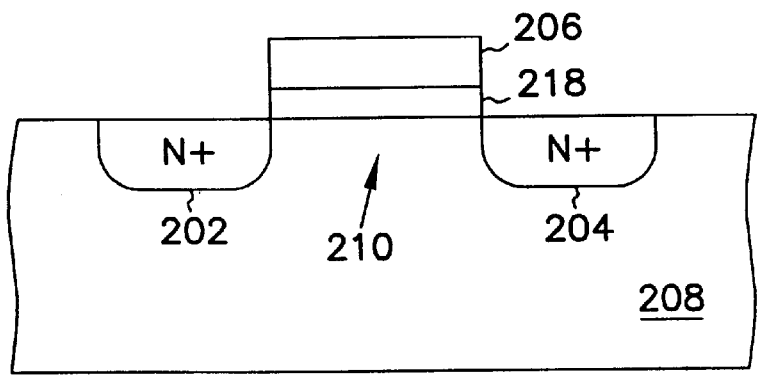
FIG. 2 is a cross-sectional view, illustrating one embodiment of a transistor according to one aspect of the invention, including a grown silicon carbide (SiC) gate insulator.

FIG. 2 is a cross-sectional view illustrating generally, by way of example, one embodiment of a partially formed n-channel FET provided by the invention. The FET includes a source region 202, a drain region 204 and a gate region 206. In one embodiment, source 202 and drain 204 are fabricated by forming regions of highly doped (n+) regions in a lightly doped (p−) silicon semiconductor substrate 208. In another embodiment, substrate 208 includes a thin semiconductor surface layer formed on an underlying insulating portion, such as in a SOI or other thin film transistor process technology. Source 202 and drain 204 are separated by a predetermined length in which a channel region 210 is formed. Gate 206 is isolated from channel 210 by an insulating layer 218, which is formed of carburized silicon, SiC formed as described above.

Figure 3:
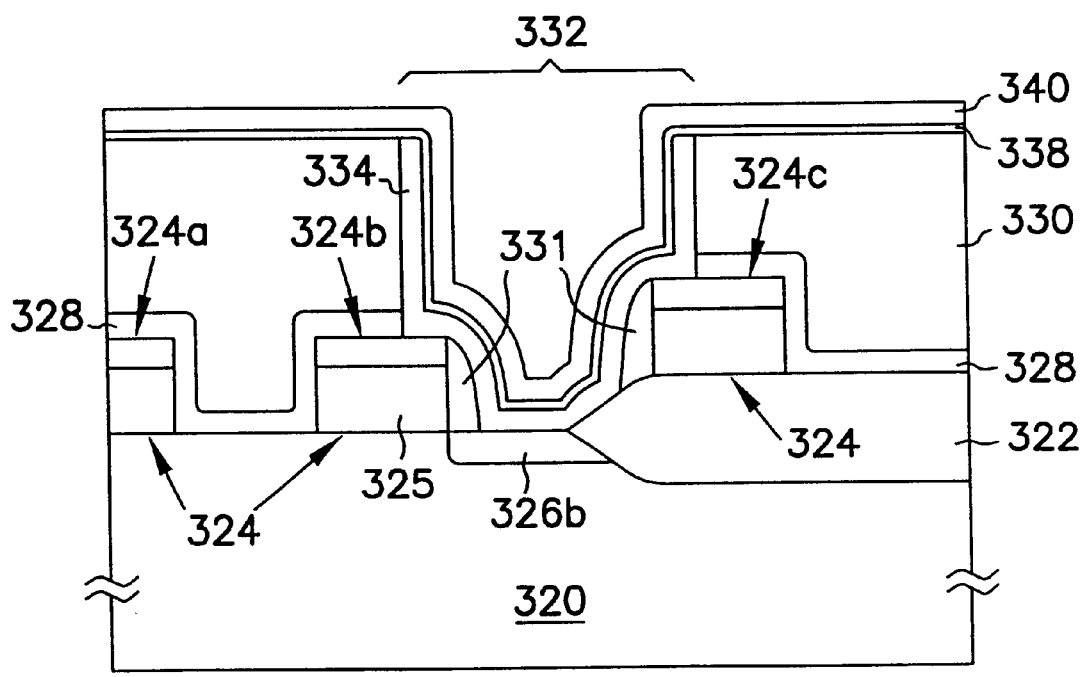
FIG. 3 is a cross-sectional view, illustrating one embodiment of a capacitor according to one aspect of the invention, including a grown silicon carbide (SiC) dielectric.

FIG. 3 is a schematic cross-sectional view of a semiconductor wafer generally illustrating a portion of a DRAM cell formed on and in the surface of a substrate 320. Thick field oxide regions 322 are selectively formed around active area regions in which memory access transistors are to be created, completely enclosing these active area regions along the surface of the wafer. The insulating thick field-oxide regions 322 isolate transistors such as memory access transistor from each other. Word lines 324a, 324b, 324c, collectively 324, have been formed on both active area regions and on field oxide regions 322. Each word line 324 serves as common gate for multiple memory access transistors. Each word line 324 has multiple stacked layers, such as: a thin carburized silicon (gate insulator) layer 325 most proximate to substrate 320; a conductive layer such as a doped polysilicon on the gate insulator layer; a silicide layer such as tungsten silicide, tantalum silicide, or titanium silicide on the conductive layer; and, an insulator on the silicide layer. In FIG. 3, the multiple stacked layers of each word line 324 are illustrated generally as only two layers: the top insulator layer, and the underlying stacked structure described above. A first insulating layer 328 acts as an etch-stop to protect underlying topography during further processing steps. The first insulating layer 328 is preferably composed of silicon nitride (nitride), but other layers of materials or combinations of layers of materials with suitable etch-stop properties may also be used.

A relatively thick second insulating layer 330 is conformally deposited, preferably by CVD, on the first insulating layer 328. The surface topography of second insulating layer 330 is minimized by planarization, preferably by chemical-mechanical polishing (CMP). The second insulating layer 330 is composed of borophosphosilicate glass (BPSG) or material compatible with use of the first insulating layer 328 as an etch-stop, such as phosphosilicate glass (PSG). The etch rate of second insulating layer 330 should be substantially greater than the etch rate of first insulating layer 328. Minimizing the topography of second insulating layer 330 by CMP planarization results in a relatively flat surface for subsequent processing steps.

The second insulating layer 330 is selectively patterned to define a buried contact opening 332. Buried contact opening 332 is anisotropically etched through second insulating layer 330 and through portions of the underlying first insulating layer 328. This anisotropic etching forms sidewall spacers 331 from first insulating layer 328. The formation of sidewall spacers 331 results from a greater vertical thickness of first insulating layer 328 in the regions adjacent to and contacting the word lines 324 than in the other anisotropically etched regions.

A source/drain diffusion 326b is formed within buried contact opening 332. In one embodiment, source/drain diffusion 326b is formed by ion-implantation of dopants into the substrate 320. Ion-implantation range of the dopants is limited by the sidewall spacers 331 and field oxide 322. Second insulating layer 330, buried contact opening 332 and word lines 324b, 324c contained within buried contact opening 332 provide topography used as a form during the conformal deposition of a thin conductive bottom plate layer 334. The conductive bottom plate layer 334 physically and electrically contacts the surface of source/drain diffusion 326b within buried contact opening 332. In one embodiment, dopants from the conductive bottom plate layer 334 are diffused by thermal processing steps into source/drain diffusion 326b, augmenting the dopant concentration of source/drain diffusion 326b. The conformal deposition of conductive bottom plate layer 334 is preferably by CVD of in situ doped or separately doped polysilicon. Hemispheric grained polysilicon may also be used to increase the surface area of conductive bottom plate layer 334.

Portions of the conductive bottom plate layer 334 which are outside the buried contact opening 332 are removed, preferably by CMP planarization, thereby exposing the second insulating layer 330. After CMP planarization, a thin layer 338 of silicon is conformally deposited on the remaining portions of the conductive bottom plate layer 334 within buried contact opening 332 and on the exposed portions of the second insulating layer 330. The thin silicon layer 338 is then carburized in the manner described above to become a thin dielectric layer 338. Further thickness may again be added by CVD deposition of amorphous SiC after the initial layer is grown. A conductive top plate layer 340, preferably polysilicon, is conformally deposited on the thin dielectric layer 338. The conformal deposition of conductive top plate layer 340 is preferably by CVD of in situ doped or separately doped polysilicon. Use of grown SiC for a capacitor dielectric avoids difficulties in working with other high dielectric constant materials, and provides a good dielectric for low voltage applications.

Figure 4:
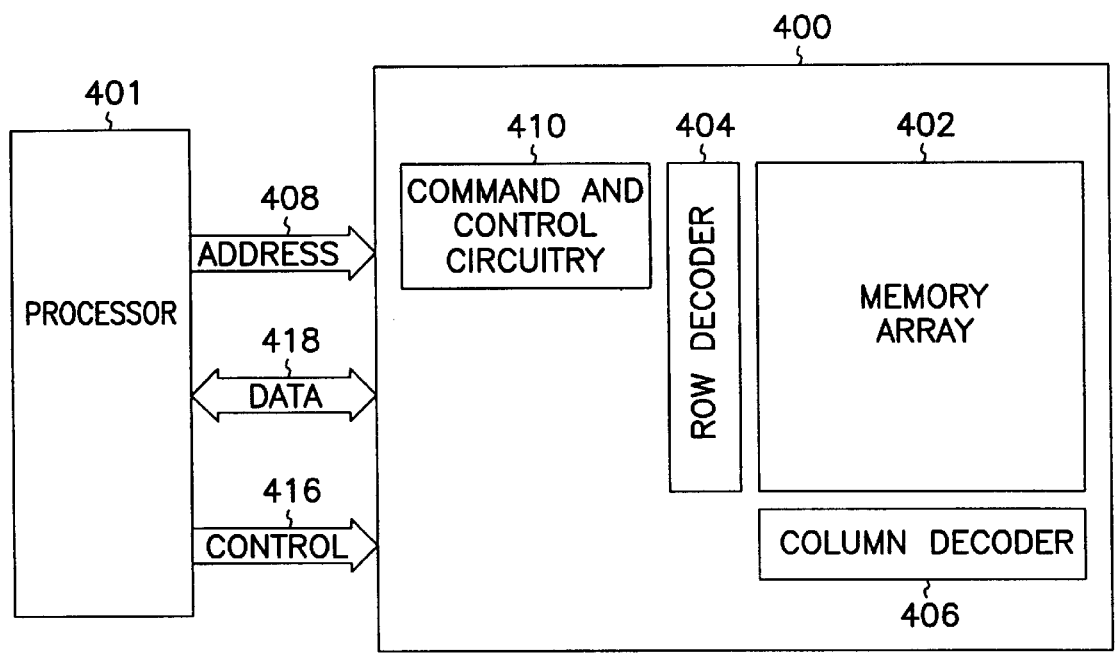
FIG. 4 is a simplified block diagram illustrating generally one embodiment of a memory system incorporating grown SiC gate insulated FETs according to one aspect of the present invention.

FIG. 4 is a simplified block diagram illustrating generally one embodiment of a memory 400 system incorporating SiC gate insulator FETs according to one aspect of the present invention. The SiC gate insulator FETs are used in various applications within memory 400 including, for example, in logic and output driver circuits. The SiC gate insulator FETs can also function as memory cell access FETs, such as in a dynamic random access memory (DRAM) embodiment of memory 400, or as other memory elements therein. In one embodiment, memory 400 is a flash EEPROM, and the SiC gate FETs are floating gate transistors that are used for nonvolatile storage of data as charge on the SiC floating gates. However, the SiC gate FETs can also be used in other types of memory systems, including SDRAM, SLDRAM and RDRAM devices, or in programmable logic arrays (PLAs), or in any other application in which transistors are used.

Flash EEPROM memory 400 comprises a memory array 402 of multiple memory cells. Row decoder 404 and column decoder 406 decode addresses provided on address lines 408 to access addressed SiC isolated floating gate transistors in the memory cells in memory array 402. Command and control circuitry 410 controls the operation of memory 400 in response to control signals received on control lines 416 from a processor 401 or other memory controller during read, write, and erase operations. Data is transferred between the memory 400 and the processor 401 via data lines 418.

As described above, the floating SiC isolation layers of the floating gate transistors in memory array 402 advantageously reduce the tunneling distance and increase the tunneling probabilities, thereby speeding write and erase operations of memory 400. This is particularly advantageous for "flash" EEPROMs in which many floating gate transistor memory cells must be erased simultaneously, which normally results in relatively long erasure times. By reducing the tunneling distance and increasing the tunneling probability, charge is more easily transferred to and from the SiC isolated floating gates, thereby reducing erasure times in flash EEPROMs.

Figure 5:
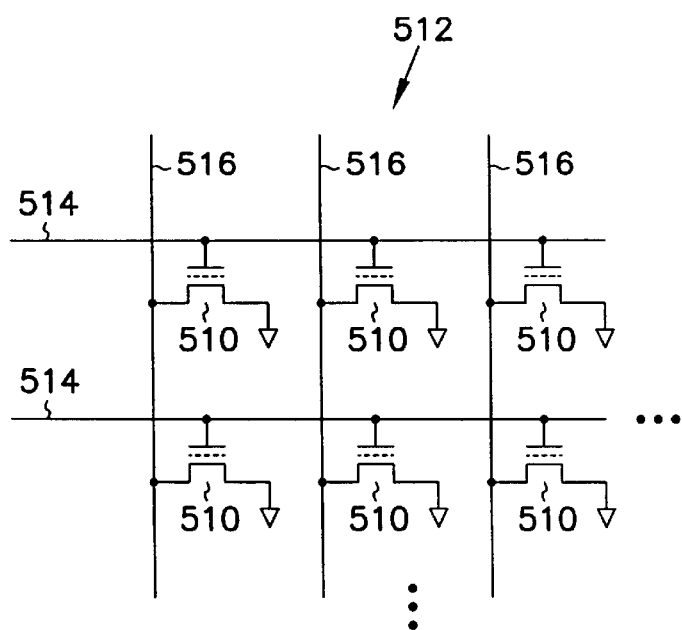
FIG. 5 is a simplified block circuit diagram of an imaging device employing photo sensitive transistors having grown SiC gate insulators.

In a further embodiment, an array of floating gate transistors 510 is used in an imaging device shown in simplified block form generally at 512 in FIG. 5. In essence, the imaging device comprises an array of floating gate transistors having SiC isolated floating gates. The transistors are arranged in a symmetrical homogenous layout corresponding to image pixels. They are formed to allow light to penetrate to the gates. Light, incident on the gates has a significant photoelectric effect due to the reduced barrier height to cause the discharge of electrons stored on the floating gates. The use of a SiC grown layer gate insulator advantageously reduces the barrier height and increases photoelectric emission over the barrier, making such transistors much more responsive to light than prior transistors using prior grown gate oxides. Access lines 514, 516 are respectively coupled to the source and control or programming gates of each transistor to read the remaining charge following exposure to light, and to recharge the transistor gates prior to further exposures in a manner consistent with other such devices. The access lines 514, 516 are also coupled to row and column decoder circuitry such as that shown in FIG. 4. In one embodiment, the array 512 may be substituted for array 402 in FIG. 4, and the decoder and control circuitry is used to read and reset the transistors 510.

Many other embodiments will be apparent to those of skill in the art upon reviewing the above description without departing from the scope of the present invention.

What is claimed is:

1. A memory device comprising:
an array of memory cells comprising capacitors that store charges representative of data and access transistors formed with amorphous carburized silicon gate insulators that were grown on a substrate;
decode circuitry coupled to the array; and
control circuitry coupled to the decode circuitry and the array.

2. The memory device of claim 1 wherein each access transistor comprises:
a source region in a substrate;
a drain region in the substrate;
a channel region in the substrate between the source region and the drain region; and
a gate separated from the channel region by one of the amorphous carburized silicon gate insulators that was grown on the substrate.

3. The memory device of claim 2 wherein:
the substrate comprises a p-type silicon substrate;
the source region comprises an n+-type source region in the substrate;
the drain region comprises an n+-type drain region in the substrate; and
the amorphous carburized silicon gate insulator was grown on the substrate in a microwave-plasma-enhanced chemical vapor deposition chamber in a hydrocarbon containing gas.

4. The memory device of claim 1 wherein the decode circuitry comprises a row decoder and a column decoder.

5. A semiconductor memory device comprising:
a memory array comprising a plurality of transistors, each of the transistors comprising a source region, a drain region, a conductive channel separating the source region and the drain region, an electrically isolated floating gate located adjacent to the channel and separated therefrom by a layer of amorphous carburized silicon insulating material that was grown on the channel, and a control gate separated from the floating gate by a layer of insulating material;
addressing circuitry to select addresses in the memory array; and
control circuitry to control read, write, and erase operations of the memory device.

6. The memory device of claim 5 wherein:
the source region comprises an n+-type source region in a p-type silicon substrate;
the drain region comprises an n+-type drain region in the substrate;
channel is in the substrate;
the control gate comprises a polysilicon control gate;
the addressing circuitry comprises a row decoder and a column decoder coupled to the memory array;
the layer of amorphous carburized silicon insulating material was grown on the substrate in a microwave-plasma-enhanced chemical vapor deposition chamber in a hydrocarbon containing gas.

7. An imaging device comprising:
an array of light sensitive carburized silicon floating gate transistors, each transistor comprising a floating gate separated from a substrate by a layer of amorphous carburized silicon that was grown on the substrate to store charges on the floating gate and to discharge the floating gate in response to light;
decode circuitry coupled to the array; and
control circuitry coupled to the decode circuitry and the array.

8. The imaging device of claim 7 wherein:
each transistor comprises:
an n+-type source region in a p-type silicon substrate;
an n+-type drain region in the substrate;
a channel region in the substrate between the source region and the drain region;
a polysilicon control gate separated from the floating gate by a layer of insulating material; and
wherein the layer of amorphous carburized silicon was grown on the substrate in a microwave-plasma-enhanced chemical vapor deposition chamber in a hydrocarbon containing gas; and
the decode circuitry comprises a row decoder and a column decoder coupled to the array to select transistors in the array.

9. A memory system comprising:
a processor; and
a memory device coupled to the processor through a plurality of lines, the memory device comprising:
a control circuit; and
one or more transistors, each transistor comprising:
a source region in a substrate;
a drain region in the substrate;
a channel region in the substrate between the source region and the drain region; and
a gate separated from the channel region by a layer of amorphous carburized silicon that was grown on the substrate.

10. The memory system of claim 9 wherein:
the lines comprise a plurality of address lines, a plurality of data lines, and a plurality of control lines;
the substrate comprises a p-type silicon substrate;
the source region comprises an n+-type source region in the substrate;
the drain region comprises an n+-type drain region in the substrate;
the memory device further comprises an array of memory cells, a row decoder, and a column decoder;
the gate comprises a floating gate;
each transistor further comprises a polysilicon control gate separated from the floating gate by a layer of insulating material; and
the layer of amorphous carburized silicon was grown on the substrate in a microwave-plasma-enhanced chemical vapor deposition chamber in a hydrocarbon containing gas.

11. The memory system of claim 9 wherein:
the lines comprise a plurality of address lines, a plurality of data lines, and a plurality of control lines;
the substrate comprises a p-type silicon substrate;
the source region comprises an n+-type source region in the substrate;
the drain region comprises an n+-type drain region in the substrate;
the memory device further comprises a row decoder and a column decoder; and
the layer of amorphous carburized silicon was grown on the substrate in a microwave-plasma-enhanced chemical vapor deposition chamber in a hydrocarbon containing gas.

12. The memory system comprising:

a processor; and a memory device coupled to the processor through a plurality of lines, the memory device comprising:
   a control circuit; and
   an array of memory cells, each memory cell comprising:
      a source region in a substrate;
      a drain region in the substrate;
      a channel region in the substrate between the source region and the drain region; and
      a gate separated from the channel region by a layer of amorphous carburized silicon that was grown on the substrate.

13. The memory system of claim 12 wherein:

the lines comprise a plurality of address lines, a plurality of data lines, and a plurality of control lines;

the substrate comprises a p-type silicon substrate;

the source region comprises an n+-type source region in the substrate;

the drain region comprises an n+-type drain region in the substrate;

the memory device further comprises a row decoder and a column decoder; and the layer of amorphous carburized silicon was grown on the substrate in a microwave-plasma-enhanced chemical vapor deposition chamber in a hydrocarbon containing gas.

14. The memory system of claim 12 wherein:

the lines comprise a plurality of address lines, a plurality of data lines, and a plurality of control lines;

the substrate comprises a p-type silicon substrate;

the source region comprises an n+-type source region in the substrate;

the drain region comprises an n+-type drain region in the substrate;

the gate comprises a floating gate;

each memory cell further comprises a polysilicon control gate separated from the floating gate by a layer of insulating material;

the layer of amorphous carburized silicon was grown on the substrate in a microwave-plasma-enhanced chemical vapor deposition chamber in a hydrocarbon containing gas; and the memory device further comprises a row decoder and a column decoder.

15. A memory system comprising:

a processor; and a memory device coupled to the processor through a plurality of lines, the memory device comprising:
   a control circuit; and
   an array of memory cells, each memory cell comprising:
      a source region in a substrate;
      a drain region in the substrate;
      a channel region in the substrate between the source region and the drain region;
      a floating gate separated from the channel region by a layer of amorphous carburized silicon that was grown on the substrate; and
      a control gate separated from the floating gate by a layer of insulating material.

16. The memory system of claim 15 wherein:

the lines comprise a plurality of address lines, a plurality of data lines, and a plurality of control lines;

the substrate comprises a p-type silicon substrate;

the source region comprises an n+-type source region in the substrate;

drain region comprises an n+-type drain region in the substrate;

the control gate comprises a polysilicon control gate separated from the floating gate by a layer of insulating material;

the layer of amorphous carburized silicon was grown on the substrate in a microwave-plasma-enhanced chemical vapor deposition chamber in a hydrocarbon containing gas; and the memory device further comprises a row decoder and a column decoder.

17. A memory system comprising:

a processor; and a memory device coupled to the processor through a plurality of address lines, a plurality of data lines, and a plurality of control lines, the memory device comprising:
   a control circuit;
   a row decoder;
   a column decoder; and
   an array of memory cells, each memory cell comprising:
      a source region in a substrate;
      a drain region in the substrate;
      a channel region in the substrate between the source region and the drain region; and
      a gate separated from the channel region by a layer of amorphous carburized silicon that was grown on the substrate.

18. The memory system of claim 17 wherein:

the substrate comprises a p-type silicon substrate;

the source region comprises an n+-type source region in the substrate;

the drain region comprises an n+-type drain region in the substrate; and the layer of amorphous carburized silicon was grown on the substrate in a microwave-plasma-enhanced chemical vapor deposition chamber in a hydrocarbon containing gas.

19. The memory system of claim 17 wherein:

the substrate comprises a p-type silicon substrate;

the source region comprises an n+-type source region in the substrate;

the drain region comprises an n+-type drain region in the substrate;

the gate comprises a floating gate;

the layer of amorphous carburized silicon was grown on the substrate in a microwave-plasma-enhanced chemical vapor deposition chamber in a hydrocarbon containing gas; and each memory cell further comprises a polysilicon control gate separated from the floating gate by a layer of insulating material.

20. A memory system comprising:

a processor; and a memory device coupled to the processor through a plurality of address lines, a plurality of data lines, and a plurality of control lines, the memory device comprising:

a control circuit;

a row decoder;

a column decoder; and an array of memory cells, each memory cell comprising:
- a source region in a substrate;
- a drain region in the substrate;
- a channel region in the substrate between the source region and the drain region;
- a floating gate separated from the channel region by a layer of amorphous carburized silicon that was grown on the substrate; and
- a control gate separated from the floating gate by a layer of insulating material.

21. The memory system of claim 20 wherein:

the substrate comprises a p-type silicon substrate;

the source region comprises an n+-type source region in the substrate;

the drain region comprises an n+-type drain region in the substrate;

the control gate further comprises a polysilicon control gate; and the layer of amorphous carburized silicon was grown on the substrate in a microwave-plasma-enhanced chemical vapor deposition chamber in a hydrocarbon containing gas.

22. A memory system comprising:

a processor; and a memory device coupled to the processor through a plurality of lines, the memory device comprising:
- a control circuit; and
- an array of memory cells, each memory cell comprising:
  - a source region in a substrate;
  - a drain region in the substrate;
  - a channel region in the substrate between the source region and the drain region;
  - a gate; and
  - means for separating the gate from the channel region.

23. The memory system of claim 22 wherein:

the lines comprise a plurality of address lines, a plurality of data lines, and a plurality of control lines; and the memory device further comprises a row decoder and a column decoder.

24. The memory system of claim 22 wherein:

the gate comprises a floating gate;

the substrate comprises a p-type silicon substrate;

the source region comprises an n+-type source region in the substrate; and the drain region comprises an n+-type drain region in the substrate.

\* \* \* \* \*

UNITED STATES PATENT AND TRADEMARK OFFICE
CERTIFICATE OF CORRECTION

PATENT NO. : 6,731,531 B1
DATED : May 4, 2004
INVENTOR(S) : Forbes et al.

It is certified that error appears in the above-identified patent and that said Letters Patent is hereby corrected as shown below:

<u>Title page,</u>
Item [56], References Cited, FOREIGN PATENT DOCUMENTS, insert

| | | | | | |
|---|---|---|---|---|---|
| -- | JP | 08-255878-TR | 10/1996 | H01L | 27/10 |
| | JP | 60-024678 | 02/1985 | K06 | 9/36 -- . |

U.S. PATENT DOCUMENTS, below "6,365,919 B1" insert

| | | | | |
|---|---|---|---|---|
| -- | 4,897,710 | 01/1990 | Suzuki et al. | 357 71 |
| | 5,366,713 | 11/1994 | Sichanugrist et al. | 423 346 |
| | 5,441,901 | 08/1995 | Candelaria | 437 31 |
| | 5,672,889 | 09/1997 | Brown | 257 77 |
| | 5,861,346 | 01/1999 | Hamza et al. | 438 869 |
| | 5,926,740 | 07/1999 | Forbes et al. | 438 763 |
| | 6,297,521 | 10/2001 | Forbes et al. | 257 76 |
| | 6,309,907 | 10/2001 | Forbes et al. | 438 108 |
| | 4,118,795 | 10/1978 | Frye et al. | 365 222 |
| | 4,384,349 | 05/1983 | McElroy | 365 185.02 |
| | 5,388,069 | 02/1995 | Kokubo | 365 185 |
| | 5,424,993 | 06/1995 | Lee et al. | 365 218 |
| | 5,438,544 | 08/1995 | Makino | 365 185 |
| | 5,467,306 | 11/1995 | Kaya et al. | 365 185.2 |
| | 5,493,140 | 02/1996 | Iguchi | 257 316 |
| | 5,828,101 | 10/1998 | Endo | 257 330 |
| | 6,307,775 | 10/2001 | Forbes et al. | 365 185.01 |
| | 4,598,305 | 07/1986 | Chiang et at. | 357 23.7 |
| | 4,736,317 | 04/1988 | Hu et at. | 364 200 |
| | 4,816,883 | 03/1989 | Baldi | 357 23.5 |
| | 4,994,401 | 02/1991 | Ukai | 437 40 |
| | 5,360,491 | 11/1994 | Carey et al. | 136 256 |
| | 5,367,306 | 11/1994 | Holton | 342 386 |
| | 5,409,501 | 04/1995 | Zauns-Huber et al. | 8 94.29 |
| | 5,425,860 | 06/1995 | Truher et al | 204 192.23 |
| | 5,623,160 | 04/1997 | Liberkowski | 257 621 -- . |

OTHER PUBLICATIONS,
"Mohammed" reference, delete "Mohammed" and insert -- Mohammad --, therefor.
"Pancove J., et al., reference, delete "Pancove" and insert -- Pankove --, therefor.
"Zirinsky, S., et al.," reference, below "pp. 147-149, (1971)., insert --

UNITED STATES PATENT AND TRADEMARK OFFICE
CERTIFICATE OF CORRECTION

PATENT NO. : 6,731,531 B1
DATED : May 4, 2004
INVENTOR(S) : Forbes et al.

It is certified that error appears in the above-identified patent and that said Letters Patent is hereby corrected as shown below:

OTHER PUBLICATIONS cont'd.,

BELTRAM, F.,et al. ,"Memory phenomena in heterojunction structures: Evidence for suppressed thermionic emission", Appl. Phys. Lett., 53(5), (1988), pp. 376-378.

LOTT, J.,et al. ,"Anisotropic thermionic emission of electrons contained in GaAs/AlAs floating gate device structures", Appl. Phys. Lett., 55(12), (1989), pp. 1226-1228.

NEUDECK, P.,et al. ,"Electrical Characterization of a JFET-Accessed GaAs Dynamic RAM Cell", IEEE Electron Device Letters, 10(11), (1989), pp. 477-480.

QIAN, Q.,et al. ,"Multi-Day Dynamic Storage of Holes at the AlAs/GaAs Interface", IEEE Electron Device Letters, EDL-7(11), (1986), pp. 607-609.

SHARMA, B.,et al. ,"Heterojunction Devices", In: Semiconductor Heterojunctions, Pergamon Press, New York, (1974),pp. 133-137.

STREETMAN, B., In: Solid State Electronic Devices, 4th Edition, Prentice Hall, New Jersey, (1995), pp. 217-219, 392-394.

SZE, S.M., In: Physics of Semiconductor Devices, 2nd Edition, John Wiley & Sons, New York, (1981), pp.122-129,700-703, 708-710,763-765.

BOERINGER, DANIEL W., et al., "Avalanche amplification of multiple resonant tunneling through parallel silicon microcrystallites", Physical Rev. B, 51, (1995), pp. 13337-13343.

EDELBERG, E., et al., 'Visible Luminescence from Nanocrystalline silicon films produced by plasma enhanced chemical vapor deposition", Appl. Phys. Lett., 68, (1996), pp. 1415-1417.

HYBERTSEN, MARK S., "Absorption and Emission of Light in Nanoscale Silicon Structures", Phys. Rev. Lett., 72, (1994), pp. 1514-1517.

KATO, MASATAKA , et at., "Read-Disturb Degradation Mechanism due to Electron Trapping in the Tunnel Oxide for Low-voltage Flash Memories", IEEE Electron Device Meeting, (1994), pp. 45-48.

SCHOENFELD, O. , et al., "Formation of Si Quantum dots in Nanocrystalline silicon", Proc. 7th Int. Conf. on Modulated Semiconductor Structures, Madrid, (1995), pp. 605-608.

TSU, RAPHAEL, et al., "Slow Conductance oscillations in nanoscale silicon clusters of quantum dots", Appl. Phys. Lett., 65, (1994), pp. 842-844.

TSU, R. , et al., "Tunneling in Nanoscale Silicon Particles Embedded in an a SiO2 Matrix", Abstract, IEEE Device Research Conference, (1996), pp. 178-179.

YE, QIU-YI, et al., "Resonant Tunneling via Microcrystalline-silicon quantum confinement", Physical Rev. B, 44, (1991), pp. 1806-1811.

ZHAO, X., et at., "Nanocrystalline Si: a material constructed by Si quantum dots", 1st Int. Conf. on Low Dimensional Structures and Devices, Singapore, (1995), pp. 467-471.

NAKAMURA, J. , et at., "CMOS Active Pixel Image Sensor with Simple Floating Gate Pixels", IEEE Transactions on Electron Devices, 42, (1995), 1693-1694.

RUSKA, W. S., "Microelectronic Processing", McGraw-Hill Book Co., (1987), 281.

WOLF, S., Silicon Processing for the VLSI Era, Vol. 3, Lattice Press, Sunset Beach, CA, (1995), 311-312. - -.

UNITED STATES PATENT AND TRADEMARK OFFICE
CERTIFICATE OF CORRECTION

PATENT NO. : 6,731,531 B1
DATED : May 4, 2004
INVENTOR(S) : Forbes et al.

It is certified that error appears in the above-identified patent and that said Letters Patent is hereby corrected as shown below:

Column 7,
Line 55, insert -- the -- before "channel".

Column 9,
Line 1, delete "The" and insert -- A --, therefor.

Column 10,
Line 4, insert -- the --before "drain".

Signed and Sealed this

Fourteenth Day of December, 2004

JON W. DUDAS
*Director of the United States Patent and Trademark Office*